(12) United States Patent
Jung et al.

(10) Patent No.: US 9,741,957 B2
(45) Date of Patent: Aug. 22, 2017

(54) ORGANIC LIGHT EMITTING DISPLAY APPARATUS

(71) Applicant: LG Display Co., Ltd., Seoul (KR)

(72) Inventors: YoungKwan Jung, Paju-si (KR); Heedong Choi, Uiwang-si (KR); Seunghyun Kim, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/197,625

(22) Filed: Jun. 29, 2016

(65) Prior Publication Data
US 2017/0125714 A1 May 4, 2017

(30) Foreign Application Priority Data
Oct. 29, 2015 (KR) .................. 10-2015-0151357

(51) Int. Cl.
H01L 51/52 (2006.01)
H01L 51/50 (2006.01)

(52) U.S. Cl.
CPC ........ H01L 51/504 (2013.01); H01L 51/5088 (2013.01); H01L 51/5092 (2013.01); H01L 51/5218 (2013.01); H01L 51/5234 (2013.01); H01L 2251/5315 (2013.01); H01L 2251/558 (2013.01)

(58) Field of Classification Search
None
See application file for complete search history.

(56) References Cited

U.S. PATENT DOCUMENTS

| 8,564,190 | B2* | 10/2013 | Seo | ........................ C09K 11/06 313/504 |
|---|---|---|---|---|
| 2006/0289882 | A1 | 12/2006 | Nishimura et al. | |
| 2011/0073844 | A1* | 3/2011 | Pieh | .................... H01L 51/5036 257/40 |
| 2012/0205685 | A1 | 8/2012 | Seo et al. | |
| 2014/0183494 | A1* | 7/2014 | Kam | ................... H01L 51/5088 257/40 |
| 2015/0034923 | A1* | 2/2015 | Kim | ..................... H01L 51/5044 257/40 |
| 2015/0060812 | A1* | 3/2015 | Kim | ..................... H01L 27/3209 257/40 |
| 2015/0060825 | A1* | 3/2015 | Song | .................. H01L 51/5278 257/40 |
| 2015/0144897 | A1* | 5/2015 | Kang | ................. H01L 51/5076 257/40 |

(Continued)

FOREIGN PATENT DOCUMENTS

KR 20160067667 A 6/2016

Primary Examiner — Michael Lebentritt
(74) Attorney, Agent, or Firm — Fenwick & West LLP

(57) ABSTRACT

Disclosed is an organic light emitting display (OLED) apparatus which facilitates to lower a driving voltage and to improve a lifespan by optimizing a balance of electrons and holes among a plurality of stacks, wherein the OLED apparatus may include the plurality of stacks disposed between an anode and a cathode, and a plurality of charge generation layers for supplying charges to the plurality of stacks, wherein a thickness of the charge generation layer disposed relatively close to the anode is relatively larger than a thickness of the charge generation layer disposed relatively close to the cathode.

15 Claims, 3 Drawing Sheets

(56) References Cited

U.S. PATENT DOCUMENTS

| | | | |
|---|---|---|---|
| 2015/0144901 A1* | 5/2015 | Setz | H01L 51/5215 257/40 |
| 2015/0188066 A1* | 7/2015 | Song | H01L 51/002 257/40 |
| 2015/0188073 A1* | 7/2015 | Ahn | H01L 27/3209 257/40 |
| 2015/0357592 A1* | 12/2015 | Li | H01L 51/5278 257/40 |
| 2016/0181561 A1* | 6/2016 | Lee | H01L 51/5278 257/40 |
| 2016/0293879 A1* | 10/2016 | Chen | H01L 51/5068 |
| 2017/0033307 A1* | 2/2017 | Choi | H01L 51/5265 |
| 2017/0084855 A1* | 3/2017 | Kam | H01L 51/504 |
| 2017/0084856 A1* | 3/2017 | Kum | H01L 51/504 |
| 2017/0092871 A1* | 3/2017 | Kim | H01L 51/0067 |

\* cited by examiner

FIG. 3

|  |  | Embodiment | | Comparative Example 1 | | Comparative Example 2 | | Comparative Example 3 | |
|---|---|---|---|---|---|---|---|---|---|
| T2(Å) | T2P(Å) | 220 (1) | 70 (1) | 220 (1) | 70 (1) | 220 (1) | 70 (1) | 250 (1) | 100 (1) |
|  | T2N(Å) |  | 150 (2.14) |  | 150 (2.14) |  | 150 (2.14) |  | 150 (1.5) |
| T1(Å) | T1P(Å) | 320 (1.45) | 120 (1) | 220 (1) | 70 (1) | 270 (1.23) | 70 (1) | 220 (0.88) | 70 (1) |
|  | T1N(Å) |  | 200 (1.67) |  | 150 (2.14) |  | 200 (2.86) |  | 150 (2.14) |
| Driving Voltage(V) | | 11.81 | | 12.21 | | 12.66 | | 12.20 | |
| Lifespan(hr) (5% drop) | B | 270 | | 190 | | 85 | | - | |
|  | YG | 900 | | 600 | | 400 | | - | |

ORGANIC LIGHT EMITTING DISPLAY APPARATUS

CROSS REFERENCE TO RELATED APPLICATIONS

This application claims the benefit of the Korean Patent Application No. 10-2015-0151357 filed on Oct. 29, 2015, which is hereby incorporated by reference as if fully set forth herein.

BACKGROUND

Field of the Disclosure

Embodiments of the present disclosure relate to an organic light emitting display apparatus (OLED apparatus), and more particularly, to an organic light emitting display apparatus (OLED apparatus) which facilitates to lower a driving voltage and to improve the properties of lifespan by determining a thickness of each of charge generation layers for supplying charge to a plurality of stacks in consideration of a balance of holes and electrons between two electrodes.

Discussion of the Related Art

An organic light emitting display apparatus (OLED apparatus) is a next generation display apparatus having self-luminance properties. In more detail, the OLED apparatus displays images by producing excitons through a recombination of holes and electrons, which are respectively injected from the anode and the cathode, in a light emitting layer, and generating light with a specific wavelength by an energy emission of the produced excitons.

Unlike a liquid crystal display apparatus (LCD apparatus), the OLED apparatus does not require an additional light source. Thus, the OLED apparatus is light weight and has a thin profile. In comparison to the LCD apparatus, the OLED apparatus has various advantages with respect to wide viewing angle, good contrast ratio, rapid response speed and low power consumption, whereby the OLED apparatus has attracted great attentions as the next generation display apparatus.

SUMMARY

A white OLED apparatus may be implemented in a minimal color combination for emitting white light, for example, a color combination of red (R), green (G) and blue (B) colors, or a color combination of blue (B) and yellow (Y) colors which complement each other. Various structures of light-emitting layer may be obtained in accordance with a color combination.

There may be a method of emitting white light through the use of single light-emitting layer obtained by mixing a plurality of light-emitting molecules. For example, the single light-emitting layer disposed between two electrodes includes a host with a large band gap energy, red (R) dopant, green (G) dopant, and blue (B) dopant, wherein white light is emitted by mixing light emitted from each dopant. However, a fine control process for the light-emitting molecules to adjust a balance of white color is very difficult, and an energy transfer to the dopant is incomplete, to thereby lower a light-emission efficiency.

There may be another method of emitting white light by disposing a plurality of stacks for white color between two electrodes, and producing white light obtained by mixing light emitted from each of the plurality of stacks. For example, one stack comprises a light-emitting layer including blue (B) dopant, another stack comprises a light-emitting layer including yellow (Y) or yellow-green (YG) dopant, and the two stacks are deposited, wherein white light is emitted by mixing light emitted from the two stacks. In this case, the respective stacks are provided independently so that it facilitates an energy transfer, that is, it has an advantage of high light-emission efficiency.

However, in this method, a driving voltage of the OLED apparatus may be raised due to the plurality of layers deposited between the two electrodes. For improving the properties of color coordinates and color reproduction ratio in the OLED apparatus so as to satisfy a user's demand on high picture quality, it is necessary to increase the number of stacks or light-emitting layers between the two electrodes, which raises the driving voltage, thereby shortening a lifespan of the OLED apparatus.

In order to obviate the aforementioned problems, there is provided an OLED apparatus with a new structure which facilitates to lower a driving voltage by maintaining a balance of electrons and holes between two electrodes through an optimized charge generation layer (CGL) disposed between neighboring stacks.

To achieve these and other advantages and in accordance with the purpose of embodiments of the disclosure, as embodied and broadly described herein, there is provided an OLED apparatus which facilitates to lower a driving voltage and to improve the properties of lifespan by determining a thickness of each of charge generation layers for supplying charge to a plurality of stacks in consideration of a balance of holes and electrons between two electrodes.

It is to be understood that both the foregoing general description and the following detailed description of embodiments of the present disclosure are exemplary and explanatory and are intended to provide further explanation of the disclosure as claimed.

According to one embodiment of the present disclosure, there is provided an organic light emitting display (OLED) apparatus that may include a reflective anode and a transparent cathode facing each other; a first stack including a first light-emitting layer between the reflective anode and the transparent cathode; a second stack including a second light-emitting layer between the first stack and the transparent cathode; a third stack including a third light-emitting layer between the second stack and the transparent cathode; a first charge generation layer between the first stack and the second stack; and a second charge generation layer between the second stack and the third stack.

In the OLED apparatus according to one embodiment of the present disclosure, a thickness of the first charge generation layer may be larger than a thickness of the second charge generation layer, so that it is possible to maintain a charge balance among the plurality of stacks, thereby improving the properties of driving voltage and lifespan of the OLED apparatus.

According to one embodiment of the present disclosure, there is provided an OLED apparatus that may include a plurality of stacks disposed between an anode and a cathode; and a plurality of charge generation layers for supplying charges to the plurality of stacks, wherein a thickness of the charge generation layer disposed relatively close to the anode is larger than a thickness of the charge generation layer disposed relatively close to the cathode. Accordingly, it is possible to optimize a balance of electrons and holes among the plurality of stacks, thereby lowering a driving voltage and improving a lifespan of the OLED apparatus.

According to one embodiment of the present disclosure, there is provided an OLED apparatus that may include a plurality of stacks disposed between a reflective anode and a transparent cathode; and a plurality of charge generation layers for supplying charges to the plurality of stacks, wherein the charge generation layer being in contact with the stack having the least electron supply has the largest thickness among the plurality of charge generation layers. Accordingly, it is possible to maintain a balance of electrons and holes between the reflective anode and the transparent cathode, thereby lowering a driving voltage and improving a lifespan of the OLED apparatus.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings:

FIG. 3 is a table showing a driving voltage and a lifespan in the organic light emitting display apparatus according to comparative examples and one embodiment of the present disclosure.

DETAILED DESCRIPTION OF THE DISCLOSURE

Figure 1:
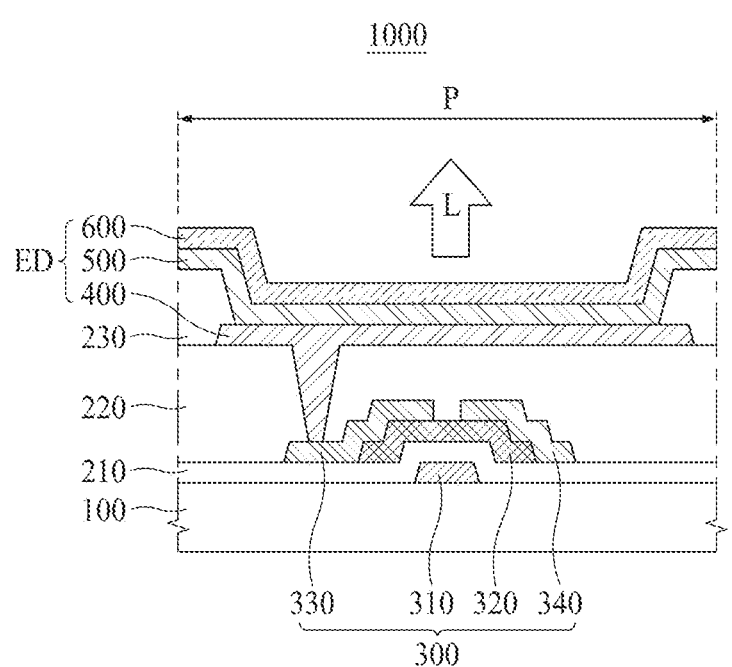
FIG. 1 is a cross sectional view illustrating an organic light emitting display apparatus according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

In description of embodiments of the present disclosure, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after', 'subsequent', 'next', and 'before', a case which is not continuous may be included unless 'just' or 'direct' is used.

In description of embodiments of the present disclosure, if two elements are overlapped with each other, the two elements may be at least partially overlapped with each other regardless of another element interposed in-between, and they may be referred to as various names.

It will be understood that, although the terms 'first', 'second', etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

For convenience of explanation, a size and thickness of each element are shown as exemplary in the drawings, but not limited to the shown size and thickness.

Features of various embodiments of the present disclosure may be partially or overall coupled to or combined with each other, and may be variously inter-operated with each other as those skilled in the art can sufficiently understand. The embodiments of the present disclosure may be carried out independently from each other, or may be carried out together in co-dependent relationship.

Hereinafter, an organic light emitting display apparatus (OLED apparatus) according to embodiments of the present disclosure will be described in detail with reference to the accompanying drawings.

FIG. 1 is a cross sectional view illustrating an OLED apparatus 1000 according to one embodiment of the present disclosure. Referring to FIG. 1, the OLED apparatus 1000 may include a substrate 100, a thin film transistor 300, and a light-emitting device (ED).

The OLED apparatus 1000 may include a plurality of pixels (P). The pixel (P) indicates a minimum unit for emitting light, which may also be referred to as a sub-pixel or a pixel region, whereby one pixel may be comprised of a plurality of sub-pixels. Also, the plurality of sub-pixels may constitute one group for expressing white light. For example, a red sub-pixel, a green sub-pixel, and a blue sub-pixel may constitute one group, or a red sub-pixel, a green sub-pixel, a blue sub-pixel, and a white sub-pixel may constitute one group. However, it is not limited to this structure, that is, various pixel and sub-pixel designs are possible. For convenience of explanation, FIG. 1 shows only one pixel (P).

The thin film transistor 300 is disposed on the substrate 100, and supplies various signals to the light-emitting device (ED). The thin film transistor 300 shown in FIG. 1 may be a driving thin film transistor connected with an anode 400 of the light-emitting device (ED). Additionally, a switching thin film transistor or a capacitor for driving the light-emitting device (ED) may be disposed on the substrate 100.

The substrate 100 is formed of an insulating material. For example, the substrate 100 may be formed of a flexible film of an organic material or a polyimide-based material.

The thin film transistor 300 may include a gate electrode 310, an active layer 320, a source electrode 330, and a drain electrode 340. Referring to FIG. 1, the gate electrode 310 is disposed on the substrate 100, and a gate insulating layer 210 covers the gate electrode 310. Also, the active layer 320 is disposed on the gate insulating layer 210, and is overlapped with the gate electrode 310. The source electrode 330 and the drain electrode 340 are disposed on the active layer 320, and the source electrode 330 and the drain electrode 340 are spaced apart from each other.

The gate electrode 310, the source electrode 330, and the drain electrode 340 are formed of a conductive material, for example, a singular-layered structure or multi-layered structure of molybdenum (Mo), aluminum (Al), chrome (Cr), gold (Au), titanium (Ti), nickel (Ni), neodymium (Nd), copper (Cu), and their alloys, but not limited to these materials.

The active layer 320 may be formed of any one of amorphous silicon (a-Si), polycrystalline silicon (poly-Si), oxide, and organic materials, but not limited to these materials.

The gate insulating layer 210 may be formed in a singular-layered structure or multi-layered structure of inorganic material, for example, silicon oxide (SiOx), silicon nitride (SiNx), and etc.

FIG. 1 shows the thin film transistor 300 having a staggered structure, but not limited to this structure. The thin film transistor 300 may have a coplanar structure.

A planarization layer 220 is disposed on the thin film transistor 300. The planarization layer 220 is configured to expose a predetermined portion of the source electrode 330. The planarization layer 220 may have a singular-layered structure or multi-layered structure, and the planarization layer 220 may be formed of an organic material. For example, the planarization layer 220 may be formed of polyimide, acryl, etc.

The light-emitting device (ED) is disposed on the planarization layer 220, wherein the light-emitting device (ED) includes an anode 400, a light-emitting unit 500, and a cathode 600. The anode 400 of the light-emitting device (ED) is connected with the source electrode 330 of the thin film transistor 300, and various signals are supplied to the light-emitting device (ED) through the thin film transistor 300. According to the kind of the thin film transistor 300, the anode 400 may be connected with the drain electrode 340 of the thin film transistor 300.

The OLED apparatus 1000 of FIG. 1 is a top emission type, wherein light (L) emitted from the light-emitting unit 500 advances to an upper direction through the cathode 600. In case of the OLED apparatus 1000 of the top emission type, the light (L) emitted from the light-emitting unit 500 does not advance to a lower direction (or a direction passing through the substrate 100), so that it is possible to provide the thin film transistor 300 disposed between the light-emitting device (ED) and the substrate 100, and overlapped with the light-emitting device (ED). Accordingly, an aperture ratio of the top emission type OLED apparatus 1000 may be more improved in comparison to an aperture ratio of a bottom emission type OLED apparatus so that it facilitates a high resolution in the OLED apparatus 1000.

A bank 230 is provided to divide the pixel (P), and the bank 230 covers an end of the anode 400. Referring to FIG. 1, the bank 230 exposes a predetermined portion of an upper surface of the anode 400. The bank 230 may be formed of an organic material, for example, any one of polyimide and photoacryl, but not limited to these materials.

If white light (L) is emitted from the light-emitting unit 500 of the OLED apparatus 1000, the white light (L) emitted from the light-emitting unit 500 passes through a color filer disposed for each pixel (P) or sub-pixel, and it is realized as a corresponding pixel (P). For example, if the white light (L) emitted from the light-emitting unit 500 passes through a red color filter, it is realized as a red pixel. If the white light (L) emitted from the light-emitting unit 500 passes through a green color filter, it is realized as a green pixel. If the white light (L) emitted from the light-emitting unit 500 passes through a blue color filter, it is realized as a blue pixel.

Figure 2:
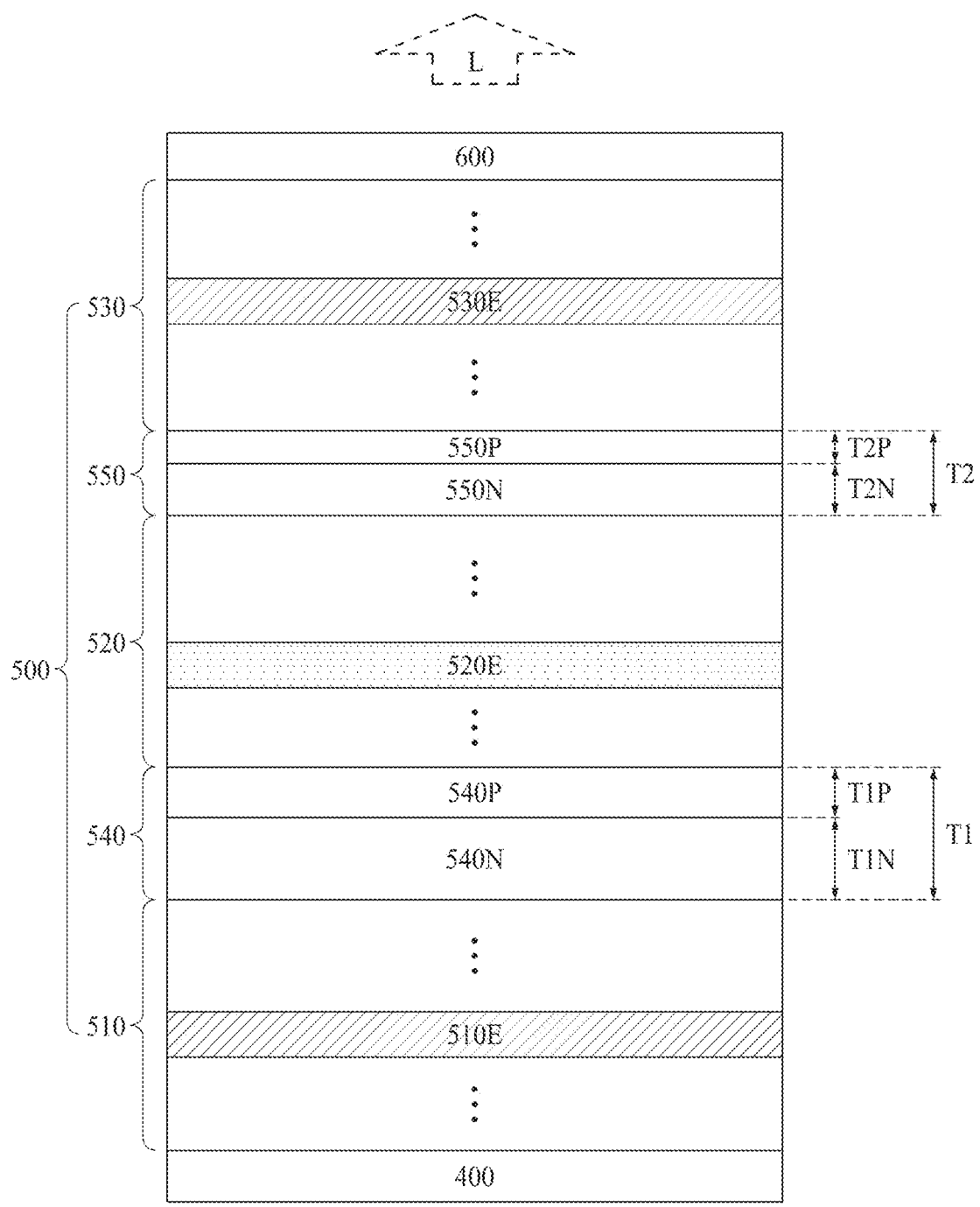
FIG. 2 is a cross sectional view illustrating the components of the organic light emitting display apparatus according to one embodiment of the present disclosure.

FIG. 2 is a cross sectional view illustrating the components of the OLED apparatus 1000 according to one embodiment of the present disclosure, which is a cross sectional view for explaining a stack structure of the light-emitting device (ED) of the OLED apparatus 1000 shown in FIG. 1.

Referring to FIG. 2, the light-emitting devices (ED) included in the OLED apparatus 1000 includes the anode 400 and cathode 600 facing each other, and the light-emitting unit 500 disposed between the anode 400 and the cathode 600. The light-emitting unit 500 can refer to all layers disposed between the anode 400 and the cathode 600, or a stack structure of all layers disposed between the anode 400 and the cathode 600.

The light-emitting unit 500 of the OLED apparatus 1000 according to one embodiment of the present disclosure includes a plurality of stacks 510, 520, and 530, and a plurality of charge generation layers 540 and 550 for supplying charges to the plurality of stacks 510, 520, and 530. In more detail, as shown in FIG. 2, the light-emitting unit 500 includes the first stack 510 including a first light-emitting layer 510E between the anode 400 and the cathode 600, the second stack 520 including a second light-emitting layer 520E between the first stack 510 and the cathode 600, and the third stack 530 including a third light-emitting layer 530E between the second stack 520 and the cathode 600. Also, the light-emitting unit 500 includes the first charge generation layer 540 between the first stack 510 and the second stack 520, and the second charge generation layer 550 between the second stack 520 and the third stack 530.

The light-emitting unit 500 of the OLED apparatus 1000 according to one embodiment of the present disclosure shown in FIG. 2 has a common emission layer structure, and emits the white light (L). The light-emitting unit 500 with the common emission layer structure may be formed by the use of a common mask with open areas corresponding to all pixels (P). The light-emitting unit 500 may be deposited in the same structure for all pixels (P) without an individual pattern for each pixel (P). The light-emitting unit 500 may be connected or disposed without disconnection from one pixel (P) to the neighboring pixel (P) so that the light-emitting unit 500 is shared by the plurality of pixels (P). Also, the respective light emitted from the plurality of stacks 510, 520, and 530 of the light-emitting unit 500 may be mixed together, whereby the white light (L) may be emitted through the cathode 600.

The anode 400 is separately disposed for each pixel (P). The anode 400 is an electrode for supplying or transmitting holes to the light-emitting unit 500, and the anode 400 is connected with the source or drain electrode of the thin film transistor.

The anode 400 is configured to have a structure with the reflection properties for smoothly reflecting the light (L) emitted from the light-emitting unit 500 to an upper direction (or a direction passing through the cathode 600). For example, the anode 400 may be formed in a dual-layered structure of a transparent layer and a reflection layer. The transparent layer supplies or transmits holes to the light-emitting unit 500, and the reflection layer reflects the light (L) emitted from the light-emitting unit 500. According to another example, the anode 400 may be formed in a threelayered structure of a transparent layer, a reflection layer, and another transparent layer. In this case, the transparent layer may be formed of TCO (transparent conductive oxide) material such as ITO (indium tin oxide) or IZO (indium zinc oxide), and the reflection layer may be formed of a metal material such as copper (Cu), silver (Ag), and palladium (Pd). According to another example, the anode 400 may be formed of a singular-layered structure of a material or structure having the properties for supplying or transmitting the hole to the light-emitting unit 500 and reflecting the light (L) emitted from the light-emitting unit 500. Accordingly, the anode 400 having the structure with the reflection properties may be referred to as a reflective anode.

The cathode 600 is disposed on the light-emitting unit 500, wherein the cathode 600 is an electrode for supplying or transmitting electrons to the light-emitting unit 500. The cathode 600 may have the properties of transparency to pass the light (L) emitted from the light-emitting unit 500 therethrough, and the cathode 600 may be formed in a single-layered structure or a multi-layered structure. The cathode 600 may be formed of a metal material layer having a small thickness, for example, silver (Ag), magnesium (Mg), silver-magnesium (Ag—Mg), etc. Also, the cathode 600 may be formed of TCO (transparent conductive oxide) material such as ITO (indium tin oxide) or IZO (indium zinc oxide). The cathode 600 with the structure having the properties of transparency may be referred to as a transparent cathode.

The light-emitting unit 500 disposed between the anode 400 and the cathode 600 includes the plurality of stacks 510, 520, and 530. In more detail, there are the first stack 510 including the first light-emitting layer 510E, the second stack 520 including the second light-emitting layer 520E, and the third stack 530 including the third light-emitting layer 530E deposited between the anode 400 and the cathode 600.

The first stack 510 is disposed on the anode 400. Among the plurality of stacks 510, 520, and 530, the first stack 510 is relatively close to the anode 400, that is, the first stack 510 is relatively farthest from the cathode 600. Thus, among the plurality of stacks 510, 520, and 530, the first stack 510 corresponds to the stack having the least electron supply from the cathode 600.

The first stack 510 may include the first light-emitting layer 510E, wherein the first light-emitting layer 510E may be formed in a single-layered or multi-layered structure including at least one host and at least one dopant.

For example, the first light-emitting layer 510E may be formed in a single-layered structure having at least one host and dopant for emitting blue light. In this case, a peak wavelength of the light emitted from the first stack 510 may have a range from 440 nm to 480 nm.

The first light-emitting layer 510E may be formed in a multi-layered structure including a layer having at least one host and dopant for emitting blue light, and another layer having at least one host and dopant for emitting red light. In this case, a peak wavelength of the light emitted from the first stack 510 may have a range from 440 nm to 650 nm.

The first light-emitting layer 510E may be formed in a single-layered structure having at least one host, dopant for emitting blue light, and dopant for emitting red light. In this case, a peak wavelength of the light emitted from the first stack 510 may have a range from 440 nm to 650 nm.

The first stack 510 is not limited to the aforementioned structures. According to a design, the first stack 510 varies in structure.

The second stack 520 is disposed on the first stack 510, or between the first stack 510 and the cathode 600. The second stack 520 includes the second light-emitting layer 520E. The second light-emitting layer 520E may be formed in a single-layered or multi-layered structure including at least one host and at least one dopant.

For example, the second light-emitting layer 520E may be formed in a single-layered structure having at least one host and dopant for emitting yellow light or yellow-green light. In this case, a peak wavelength of the light emitted from the second stack 520 may have a range from 510 nm to 580 nm.

The second light-emitting layer 520E may be formed in a multi-layered structure including a layer having at least one host and dopant for emitting yellow light or yellow-green light, and another layer having at least one host and dopant for emitting green light or red light. In this case, a peak wavelength of the light emitted from the second stack 520 may have a range from 510 nm to 650 nm.

The second stack 520 is not limited to the aforementioned structures. According to a design, the second stack 520 varies in structure.

The third stack 530 is disposed on the second stack 520, or between the second stack 520 and the cathode 600. Among the plurality of stacks 510, 520, and 530, the third stack 530 is relatively closest to the cathode 600.

The third stack 530 includes the third light-emitting layer 530E. The third light-emitting layer 530E may be formed in a single-layered or multi-layered structure including at least one host and at least one dopant.

For example, the third light-emitting layer 530E may be formed in a single-layered structure having at least one host and dopant for emitting blue light. In this case, a peak wavelength of the light emitted from the third stack 530E may have a range from 440 nm to 480 nm.

The third light-emitting layer 530E may be formed in a multi-layered structure including a layer having at least one host and dopant for emitting blue light, and another layer having at least one host and dopant for emitting red light. In this case, a peak wavelength of the light emitted from the third stack 530 may have a range from 440 nm to 650 nm.

The third light-emitting layer 530E may be formed in a single-layered structure having at least one host, dopant for emitting blue light, and dopant for emitting red light. In this case, a peak wavelength of the light emitted from the third stack 530 may have a range from 440 nm to 650 nm.

The third stack 530 is not limited to the aforementioned structures. According to a design, the third stack 530 varies in structure.

The light emitted from each of the aforementioned first stack 510, the second stack 520, and the third stack 530 may be mixed together, whereby the white light (L) from the light-emitting unit 500 may be emitted through the cathode 600.

Based on a design, each of the first stack 510, the second stack 520, and the third stack 530 may further include at least one of a hole injecting layer, a hole transporting layer, an electron transporting layer, and an electron injecting layer.

The hole injecting layer is provided for a smooth injection of holes from the anode 400. For example, the hole injecting layer may be formed of MTDATA(4,4',4"-tris(3-methylphenylphenylamino)triphenylamine), CuPc (copper phthalocyanine), or PEDOT/PSS(poly(3,4-ethylenedioxythiphene, polystyrene sulfonate), but not limited to these materials.

The hole transporting layer is provided for smoothly transmitting the holes, which are supplied or transmitted from the anode 400 or charge generation layer 540 and 550, to the light-emitting layer 510E, 520E and 530E. For example, the hole transporting layer may be formed of NPD(N,N-bis(naphthalene-1-yl)-N,N-bis(phenyl)-2,2'-dimethylbenzidine), TPD(N,N-bis-(3-methylphenyl)-N,N-bis-(phenyl)-benzidine), or Spiro-TAD(2,2'7,7'tetrakis(N,N-diphenylamino)-9,9'-spirofluorene), but not limited to these materials.

The electron transporting layer is provided for smoothly transmitting electrons, which is supplied or transmitted from the cathode 600 or charge generation layer 540 and 550, to the light-emitting layer 510E, 520E and 530E. For example, the electron transporting layer may be formed of PBD(2-(4-biphenyl)-5-(4-tert-butylphenyl)-1,3,4-oxadiazole), TAZ(3-(4-biphenyl)-4-phenyl-5-tertbutylphenyl-1,2,4-triazole), Liq(8-hydroxyquinolinolato-lithium), BAlq(Bis(2-methyl-8-quinolinolate)-4-(phenylphenolato)aluminium), or TPBi(2,2',2'-(1,3,5-benzinetriyl)-tris(1-phenyl-1-H-benzimidazole), but not limited to these materials.

The electron injecting layer is provided for smoothly injecting the electrons from the cathode 600.

Referring to FIG. 2, the light-emitting unit 500 disposed between the anode 400 and the cathode 600 includes the plurality of charge generation layers 540 and 550 for supplying the charge to the plurality of stacks 510, 520, and 530. In more detail, the first charge generation layer 540 is disposed between the first stack 510 and the second stack 520, and the second charge generation layer 550 is disposed between the second stack 520 and the third stack 530.

The first charge generation layer 540 supplies or controls the charge to the first stack 510 and the second stack 520, wherein the first charge generation layer 540 includes a first N-type charge generation layer 540N and a first P-type charge generation layer 540P. In this case, the first N-type charge generation layer 540N is relatively close to or in contact with the first stack 510, and the first P-type charge generation layer 540P is relatively close to or in contact with the second stack 520.

The second charge generation layer 550 supplies or controls the charge to the second stack 520 and the third stack 530, wherein the second charge generation layer 550 includes a second N-type charge generation layer 550N and a second P-type charge generation layer 550P. In this case, the second N-type charge generation layer 550N is relatively close to or in contact with the second stack 520, and the second P-type charge generation layer 550P is relatively close to or in contact with the third stack 530.

The first N-type charge generation layer 540N and the second N-type charge generation layer 550N may be formed of a layer doped with alkali metal such as lithium (Li), sodium (Na), potassium (K) or cesium (Cs), or a layer doped with alkali earth metal such as magnesium (Mg), strontium (Sr), barium (Ba) or radium (Ra), but not limited to these materials.

Each of the first P-type charge generation layer 540P and the second P-type charge generation layer 550P may be formed of a layer with P-type dopant, but not limited to this structure.

As described above, in order to improve a color reproduction ratio and the properties of color coordinates in the OLED apparatus 1000 in accordance with a user's demand for a higher picture quality, it is necessary to increase the number of stacks or light-emitting layers in the light-emitting unit 500 of the OLED apparatus 1000. In this case, a driving voltage of the OLED apparatus 1000 is raised so that a lifespan of the OLED apparatus 1000 is shortened.

In the OLED apparatus 1000 according to one embodiment of the present disclosure, it is possible to maintain a balance of electrons or holes between the anode 400 and the cathode 600 by optimizing a thickness of each of the plurality of charge generation layers 540 and 550 for supplying the electrons or the holes to the plurality of stacks 510, 520, and 530, to thereby lower the driving voltage of the OLED apparatus 1000. This will be described in detail as follows.

In the OLED apparatus 1000 according to one embodiment of the present disclosure, generation and transfer of the hole in the light-emitting device (ED) substantially indicates a reaction synchronized with a transfer of the electron supplied from the cathode 600. That is, the generation and transfer of the hole are synchronized with the transfer of the electron supplied from the cathode 600. Thus, the balance of electron and the hole in the light-emitting device (ED) is largely influenced by the transfer properties of the electron supplied from the cathode 600.

Among the plurality of stacks 510, 520, and 530, as described above, the first stack 510 is relatively farthest away from the cathode 600, whereby the first stack 510 corresponds to the stack having the least electron supply from the cathode 600. In the OLED apparatus 1000 according to one embodiment of the present disclosure, a thickness (T1) of the first charge generation layer 540, which is relatively closest to or in contact with the first stack 510 having the least electron supply, is larger than a thickness (T2) of the second charge generation layer 550 which is relatively close to the cathode 600. Accordingly, the electron supply to the first stack 510 is increased so that it is possible to enhance a charge balance between the two electrodes 400 and 600.

The reason why the charge balance or the balance of electrons and holes in the OLED apparatus 1000 according to one embodiment of the present disclosure is important is shown as follows. The plurality of stacks 510, 520, and 530, which respectively include at least one light-emitting layer 510E, 520E and 530E, are disposed between the two electrodes 400 and 600, and are provided independently, and the light emitted from the respective stacks 510, 520, and 530 is mixed together so as to emit the white light (L). That is, in order to emit the desired white light (L), it is necessary to adjust the amount and color of the light emitted from the respective stacks 510, 520, and 530. In this case, the amount and color of the light emitted from each stack 510, 520, and 530 may be adjusted by the supply of electrons and holes injected into each of the stacks 510, 520, and 530. If the balance of electrons and holes injected into each of the stacks 510, 520, and 530 is not maintained, it is difficult to realize a smooth flow of electrons and holes between the two electrodes 400 and 600, which might cause a problem relating the increase of driving voltage in the OLED apparatus 1000. Accordingly, the charge balance or the balance of electrons and holes between the two electrodes 400 and 600 may be maintained by adjusting the supply of electrons and holes injected to the respective stacks 510, 520, and 530 so that it is possible to effectively improve the properties of driving voltage and light efficiency in the OLED apparatus 1000.

If the thickness (T1) of the first charge generation layer 540 is the same as or smaller than the thickness (T2) of the second charge generation layer 550, the electron is not sufficiently supplied to the first stack 510 which is the farthest away from the cathode 600, whereby the desired light is not emitted from the first stack 510. Furthermore, it is difficult to realize the smooth flow of electrons and holes to the respective stacks 510, 520, and 530, whereby the driving voltage of the OLED apparatus 100 is raised.

In the OLED apparatus 1000 according to one embodiment of the present disclosure, preferably, the thickness (T1)

of the first charge generation layer 540 is within a range from 1.4 times to 1.6 times in comparison to the thickness (T2) of the second charge generation layer 550, to thereby effectively maintain the balance of electrons and holes between the two electrodes 400 and 600. If the thickness (T1) of the first charge generation layer 540 is less than 1.4 times or more than 1.6 times in comparison to the thickness (T2) of the second charge generation layer 550, the electrons are not sufficiently supplied to the first stack 510, or the electrons are excessively supplied to the first stack 510 so that the balance of electrons and holes in the light-emitting unit 500 is not maintained, and furthermore, the driving voltage of the OLED apparatus 1000 is raised.

According to one embodiment of the present disclosure, in the OLED apparatus 1000 including the plurality of stacks 510, 520, and 530, and the plurality of charge generation layers 540 and 550 for supplying the charge to the plurality of stacks 510, 520, and 530, the thickness of the charge generation layer which is relatively close to the anode 400 is larger than the thickness of the charge generation layer which is relatively close to the cathode 600, to thereby maintain the charge balance among the plurality of stacks 510, 520, and 530. That is, the thickness (T1) of the first charge generation layer 540 disposed relatively close to the anode 400 is larger than the thickness (T2) of the second charge generation layer 550 disposed relatively close to the cathode 600, whereby the charge balance between the two electrodes 400 and 600 is maintained, and the driving voltage of the OLED apparatus 1000 is lowered.

As described above, the charge generation layers 540 and 550 adjust the electrons or holes supplied to the adjacent stacks. In detail, the first P-type charge generation layer 540P of the first charge generation layer 540 supplies the holes to the second stack 520 disposed adjacent thereto. In this case, the electrons, which are generated in synchronization with the holes inside the first P-type charge generation layer 540P, are supplied to the first stack 510 through the first N-type charge generation layer 540N. That is, the first N-type charge generation layer 540N adjusts the electrons supplied to the first stack 510 disposed adjacent thereto. In the same manner, the second P-type charge generation layer 550P of the second charge generation layer 550 supplies the holes to the third stack 530 disposed adjacent thereto, and the electrons generated in synchronization with the holes inside the second P-type charge generation layer 550P are supplied to the second stack 520 through the second N-type charge generation layer 550N. That is, the second N-type charge generation layer 550N adjusts the electrons supplied to the second stack 520 disposed adjacent thereto.

In the OLED apparatus 1000 according to one embodiment of the present disclosure, a thickness (T1N) of the first N-type charge generation layer 540N in the first charge generation layer 540 is larger than a thickness (T1P) of the first P-type charge generation layer 540P in the first charge generation layer 540, to thereby smoothly adjust the supply of electrons to the first stack 510. In more detail, the thickness (T1N) of the first N-type charge generation layer 540N has a value within a range from 1.5 times to 1.7 times in comparison to the thickness (T1P) of the first P-type charge generation layer 540P, to thereby effectively adjust or maintain the supply of electrons to the first stack 510 and the balance of electrons and holes among the plurality of stacks 510, 520, and 530.

Also, a thickness (T2N) of the second N-type charge generation layer 550N in the second charge generation layer 550 is larger than a thickness (T2P) of the second P-type charge generation layer 550P in the second charge generation layer 550, whereby the supply of electrons is smoothly adjusted to the second stack 520, wherein the electrons are smoothly supplied to the second stack 520 having the electron supply relatively less than the third stack 530. Accordingly, it is possible to more precisely adjust the supply of electrons and holes in the plurality of stacks 510, 520, and 530, to thereby effectively improve the charge balance of the OLED apparatus 1000.

FIG. 3 is a table showing the driving voltage and lifespan in the organic light emitting display apparatus according to comparative examples and one embodiment of the present disclosure.

The embodiment of FIG. 3 has the plurality of charge generation layers for supplying the charge to the plurality of stacks, wherein the thickness of the charge generation layer which is relatively close to the anode is larger than the thickness of the charge generation layer which is relatively close to the cathode. Also, the thickness of the N-type charge generation layer included in the charge generation layer which is relatively close to the anode is larger than the thickness of the P-type charge generation layer included in the charge generation layer which is relatively close to the anode.

In more detail, the embodiment of FIG. 3 has the structure of the OLED apparatus 1000 described with reference to FIG. 2, wherein the thickness (T1) of the first charge generation layer 540 is larger than the thickness (T2) of the second charge generation layer 550, and the thickness (T1N) of the first N-type charge generation layer 540N of the first charge generation layer 540 is larger than the thickness (T1P) of the first P-type charge generation layer 540P of the first charge generation layer 540. In this case, the first stack 510 includes the hole injecting layer, the hole transporting layer, the light-emitting layer 510E having dopant for emitting the blue light, and the electron transporting layer. The second stack 520 includes the hole transporting layer, the light-emitting layer 520E having dopant for emitting the yellow-green light, and the electron transporting layer. The third stack 530 includes the hole transporting layer, the light-emitting layer 530E having dopant for emitting the blue light, the electron transporting layer, and the electron injecting layer.

Referring to FIG. 3, in case of the embodiment, the thickness (Ti) of the first charge generation layer 540 is 320 Å, the thickness (T2) of the second charge generation layer 550 is 220 Å, and a ratio of the thickness (T1) of the first charge generation layer 540 to the thickness (T2) of the second charge generation layer 550 is at 1.45:1. That is, the thickness (T1) of the first charge generation layer 540 is about 1.45 times in comparison to the thickness (T2) of the second charge generation layer 550. Also, the thickness (T1N) of the first N-type charge generation layer 540N is 200 Å, the thickness (T1P) of the first P-type charge generation layer 540P is 120 Å, and a ratio of the thickness (T1N) of the first N-type charge generation layer 540N to the thickness (T1P) of the first P-type charge generation layer 540P is at 1.67:1. That is, the thickness (T1N) of the first N-type charge generation layer 540N is about 1.67 times in comparison to the thickness (T1P) of the first P-type charge generation layer 540P.

In the structure of the embodiment, the driving voltage is 11.81V. Also, 5% drop lifespan is 270 hr when the structure of the embodiment is driven in the blue light, and 5% drop lifespan is 900 hr when the structure of the embodiment is driven in the yellow-green light. Herein, on assumption that an initial luminance of the OLED apparatus is 100%, 5% drop lifespan indicates the time consumed when the initial luminance is dropped to 95%.

The structure of each stack 510, 520, and 530 of the comparative example 1 of FIG. 3 is the same as the structure of each stack included in the embodiment of FIG. 3, however, a thickness of each charge generation layer 540 and 550 included in the comparative example 1 is different from the thickness of each charge generation layer included in the embodiment. In the comparative example 1, a thickness (T1) of the first charge generation layer 540 is 220 Å, a thickness (T2) of the second charge generation layer 550 is 220 Å, and a ratio of the thickness (T1) of the first charge generation layer 540 to the thickness (T2) of the second charge generation layer 550 is at 1:1.

Also, a thickness (T1N) of a first N-type charge generation layer 540N is 150 Å, a thickness (T1P) of a first P-type charge generation layer 540P is 70 Å, and a ratio of the thickness (T1N) of the first N-type charge generation layer 540N to the thickness (T1P) of the first P-type charge generation layer 540P is at 2.14:1. That is, the thickness (T1N) of the first N-type charge generation layer 540N is 2.14 times in comparison to the thickness (T1P) of the first P-type charge generation layer 540P.

In the structure of the comparative example 1, a driving voltage is 12.21V. Also, 5% drop lifespan is 190 hr when the structure of the comparative example 1 is driven in the blue light, and 5% drop lifespan is 600 hr when the structure of the comparative example 1 is driven in the yellow-green light. That is, in case of the comparative example 1 wherein the thickness (T1) of the first charge generation layer 540 is the same as the thickness (T2) of the second charge generation layer 550, the balance of electrons and holes in the light-emitting unit 500 deteriorates so that the driving voltage is raised, and the lifespan is shortened, in comparison to the embodiment wherein the thickness (T1) of the first charge generation layer 540 is larger than the thickness (T2) of the second charge generation layer 550. In addition, the thickness (T1N) of the first N-type charge generation layer 540N is excessively large in comparison to the thickness (T1P) of the first P-type charge generation layer 540P, whereby the unbalanced flow of electrons and holes in the light-emitting unit 500 causes the raised driving voltage and the shortened lifespan.

The structure of each stack 510, 520, and 530 of comparative example 2 of FIG. 3 is the same as the structure of each stack included in the embodiment of FIG. 3, however, a thickness of each charge generation layer 540 and 550 included in the comparative example 2 is different from the thickness of each charge generation layer included in the embodiment. In the comparative example 2, a thickness (T1) of the first charge generation layer 540 is 270 Å, a thickness (T2) of the second charge generation layer 550 is 220 Å, and a ratio of the thickness (T1) of the first charge generation layer 540 to the thickness (T2) of the second charge generation layer 550 is at 1.23:1. Also, a thickness (T1N) of a first N-type charge generation layer 540N is 200 Å, a thickness (T1P) of a first P-type charge generation layer 540P is 70 Å, and a ratio of the thickness (T1N) of the first N-type charge generation layer 540N to the thickness (T1P) of the first P-type charge generation layer 540P is at 2.86:1.

In the structure of the comparative example 2, a driving voltage is 12.66V. Also, 5% drop lifespan is 85 hr when the structure of the comparative example 2 is driven in the blue light, and 5% drop lifespan is 400 hr when the structure of the comparative example 2 is driven in the yellow-green light. That is, if the thickness (T1) of the first charge generation layer 540 is not sufficiently large in comparison to the thickness (T2) of the second charge generation layer 550, and the thickness (T1N) of the first N-type charge generation layer 540N is excessively large in comparison to the thickness (T1P) of the first P-type charge generation layer 540P, the balance of electrons and holes between the anode 400 and the cathode 600 is not optimized so that the driving voltage is largely raised and the lifespan is shortened.

The structure of each stack 510, 520, and 530 of comparative example 3 of FIG. 3 is the same as the structure of each stack included in the embodiment of FIG. 3, however, a thickness of each charge generation layer 540 and 550 included in the comparative example 3 is different from the thickness of each charge generation layer included in the embodiment. In the comparative example 3, a thickness (T1) of the first charge generation layer 540 is 220 Å, a thickness (T2) of the second charge generation layer 550 is 250 Å, and a ratio of the thickness (T1) of the first charge generation layer 540 to the thickness (T2) of the second charge generation layer 550 is at 0.88:1. Also, a thickness (T1N) of a first N-type charge generation layer 540N is 150 Å, a thickness (T1P) of a first P-type charge generation layer 540P is 70 Å, and a ratio of the thickness (T1N) of the first N-type charge generation layer 540N to the thickness (T1P) of the first P-type charge generation layer 540P is at 2.14:1.

In the structure of the comparative example 3, a driving voltage is 12.20V. That is, if the thickness (T1) of the first charge generation layer 540 is smaller than the thickness (T2) of the second charge generation layer 550, and the thickness (T1N) of the first N-type charge generation layer 540N is excessively large in comparison to the thickness (T1P) of the first P-type charge generation layer 540P, the balance of electrons and holes between the anode 400 and the cathode 600 deteriorates so that the driving voltage is raised.

As described above, in the OLED apparatus 1000 including the plurality of stacks 510, 520, and 530, and the plurality of charge generation layers 540 and 550 for supplying the charge to the plurality of stacks 510, 520, and 530, the thickness of the charge generation layer which is relatively close to the anode 400 is larger than the thickness of the charge generation layer which is relatively close to the cathode 600, whereby the charge balance among the plurality of stacks 510, 520, and 530 is optimized, that is, the driving voltage of the OLED apparatus 1000 is lowered, and the lifespan is improved. Also, if the charge generation layer which is relatively close to the anode 400 includes the N-type charge generation layer and the P-type charge generation layer, the thickness of the N-type charge generation layer is larger than the P-type charge generation layer, to thereby improve the properties of driving voltage and lifespan of the OLED apparatus.

In the OLED apparatus according to the embodiment of the present disclosure, the thickness of each of the charge generation layers for supplying the charge to the plurality of stacks is optimized so that it is possible to maintain the balance of electrons and holes between the two electrodes. Accordingly, the driving voltage is lowered, and the lifespan is improved.

According to one embodiment of the present disclosure, among the plurality of charge generation layers, the thickness of the charge generation layer which is relatively close to the anode is larger than the thickness of the charge generation layer which is relatively close to the cathode, whereby the charge balance among the plurality of stacks is maintained, that is, the driving voltage of the OLED apparatus is lowered.

According to one embodiment of the present disclosure, among the plurality of charge generation layers, the charge generation layer which is relatively close to the stack having the least electron supply has the largest thickness so that it is possible to maintain the balance of electrons and holes among the plurality of stacks, thereby lowering the driving voltage and increasing the lifespan in the OLED apparatus.

In the OLED apparatus according to one embodiment of the present disclosure, the thickness of the first charge generation layer may be 1.4 times to 1.6 times larger than the thickness of the second charge generation layer.

In the OLED apparatus according to one embodiment of the present disclosure, the first charge generation layer may include a first N-type charge generation layer and a first P-type charge generation layer, and a thickness of the first N-type charge generation layer may be larger than a thickness of the first P-type charge generation layer.

In the OLED apparatus according to one embodiment of the present disclosure, the thickness of the first N-type charge generation layer may be 1.5 times to 1.7 times larger than the thickness of the first P-type charge generation layer.

In the OLED apparatus according to one embodiment of the present disclosure, the first N-type charge generation layer may be in contact with the first stack, and the first P-type charge generation layer may be in contact with the second stack.

In the OLED apparatus according to one embodiment of the present disclosure, the second charge generation layer may include a second N-type charge generation layer and a second P-type charge generation layer, and a thickness of the second N-type charge generation layer may be larger than a thickness of the second P-type charge generation layer.

In the OLED apparatus according to one embodiment of the present disclosure, the thickness of the charge generation layer disposed close to the anode may be 1.4 times to 1.6 times larger than the thickness of the charge generation layer disposed relatively close to the cathode.

In the OLED apparatus according to one embodiment of the present disclosure, the charge generation layer disposed relatively close to the anode includes an N-type charge generation layer and a P-type charge generation layer, and a thickness of the N-type charge generation layer may be larger than a thickness of the P-type charge generation layer.

In the OLED apparatus according to one embodiment of the present disclosure, the N-type charge generation layer may be disposed relatively close to the anode, and the P-type charge generation layer may be disposed relatively close to the cathode.

In the OLED apparatus according to one embodiment of the present disclosure, light emitted from the plurality of stacks is mixed together, and the mixed light passes through the cathode so as to emit a white light.

In the OLED apparatus according to one embodiment of the present disclosure, the charge generation layer disposed closest to the reflective anode may have the largest thickness value among the plurality of charge generation layers.

In the OLED apparatus according to one embodiment of the present disclosure, the charge generation layer disposed closest to the reflective anode may include an N-type charge generation layer and a P-type charge generation layer, wherein a thickness of the P-type charge generation layer is smaller than a thickness of the N-type charge generation layer.

In the OLED apparatus according to one embodiment of the present disclosure, the N-type charge generation layer is disposed relatively close to the reflective anode, and the P-type charge generation layer is disposed relatively close to the transparent cathode.

It will be apparent to those skilled in the art that various modifications and variations can be made in the present disclosure without departing from scope of the disclosures. Thus, it is intended that the present disclosure covers the modifications and variations of this disclosure provided they come within the scope of the appended claims and their equivalents.

What is claimed is:

1. An organic light emitting display (OLED) apparatus comprising:
    a reflective anode and a transparent cathode facing each other;
    a first stack including a first light-emitting layer between the reflective anode and the transparent cathode;
    a second stack including a second light-emitting layer between the first stack and the transparent cathode;
    a third stack including a third light-emitting layer between the second stack and the transparent cathode;
    a first charge generation layer between the first stack and the second stack; and
    a second charge generation layer between the second stack and the third stack,
    wherein a thickness of the first charge generation layer is larger than a thickness of the second charge generation layer.

2. The OLED apparatus according to claim 1, wherein the thickness of the first charge generation layer is 1.4 times to 1.6 times larger than the thickness of the second charge generation layer.

3. The OLED apparatus according to claim 1, wherein the first charge generation layer includes a first N-type charge generation layer and a first P-type charge generation layer, and a thickness of the first N-type charge generation layer is larger than a thickness of the first P-type charge generation layer.

4. The OLED apparatus according to claim 3, wherein the thickness of the first N-type charge generation layer is 1.5 times to 1.7 times larger than the thickness of the first P-type charge generation layer.

5. The OLED apparatus according to claim 3, wherein the first N-type charge generation layer is in contact with the first stack, and the first P-type charge generation layer is in contact with the second stack.

6. The OLED apparatus according to claim 3, wherein the second charge generation layer includes a second N-type charge generation layer and a second P-type charge generation layer, and a thickness of the second N-type charge generation layer is larger than a thickness of the second P-type charge generation layer.

7. An OLED apparatus comprising:
    a plurality of stacks disposed between an anode and a cathode; and
    a plurality of charge generation layers for supplying charges to the plurality of stacks,
    wherein a thickness of a charge generation layer disposed relatively close to the anode is larger than a thickness of a charge generation layer disposed relatively close to the cathode.

8. The OLED apparatus according to claim 7, wherein the thickness of the charge generation layer disposed relatively close to the anode is 1.4 times to 1.6 times larger than the thickness of the charge generation layer disposed relatively close to the cathode.

9. The OLED apparatus according to claim 7, wherein the charge generation layer disposed relatively close to the anode includes an N-type charge generation layer and a P-type charge generation layer, and a thickness of the N-type charge generation layer is larger than a thickness of the P-type charge generation layer.

10. The OLED apparatus according to claim 9, wherein the N-type charge generation layer is disposed relatively close to the anode, and the P-type charge generation layer is disposed relatively close to the cathode.

11. The OLED apparatus according to claim 7, wherein light emitted from the plurality of stacks is mixed together, and the mixed light passes through the cathode so as to emit a white light.

12. An OLED apparatus comprising:
a plurality of stacks disposed between a reflective anode and a transparent cathode; and
a plurality of charge generation layers for supplying charges to the plurality of stacks,
wherein a charge generation layer being in contact with a stack having a least electron supply has a largest thickness among the plurality of charge generation layers.

13. The OLED apparatus according to claim 12, wherein a charge generation layer disposed closest to the reflective anode has a largest thickness value among the plurality of charge generation layers.

14. The OLED apparatus according to claim 13, wherein the charge generation layer disposed closest to the reflective anode includes an N-type charge generation layer and a P-type charge generation layer, wherein a thickness of the P-type charge generation layer is smaller than a thickness of the N-type charge generation layer.

15. The OLED apparatus according to claim 14, wherein the N-type charge generation layer is disposed relatively close to the reflective anode, and the P-type charge generation layer is disposed relatively close to the transparent cathode.

* * * * *